(12) United States Patent
Lai

(10) Patent No.: US 6,699,759 B2
(45) Date of Patent: Mar. 2, 2004

(54) HIGH DENSITY READ ONLY MEMORY AND FABRICATION METHOD THEREOF

(75) Inventor: Mao-Fu Lai, Taipei (TW)

(73) Assignee: Chinatech Corporation, Hsintien (TW)

( * ) Notice: Subject to any disclaimer, the term of this patent is extended or adjusted under 35 U.S.C. 154(b) by 52 days.

(21) Appl. No.: 10/103,707

(22) Filed: Mar. 25, 2002

(65) Prior Publication Data

US 2003/0001213 A1 Jan. 2, 2003

Related U.S. Application Data

(62) Division of application No. 09/894,002, filed on Jun. 29, 2001, now Pat. No. 6,462,387.

(51) Int. Cl.$^7$ ................. H01L 21/8234; H01L 21/8336
(52) U.S. Cl. .................. 438/275; 438/257; 438/268; 438/279
(58) Field of Search ................. 438/275, 276, 438/278, 279, 257, 268, 269

(56) References Cited

U.S. PATENT DOCUMENTS

| 4,774,556 | A | * | 9/1988 | Fujii et al. .................. 257/316 |
| 5,455,435 | A | * | 10/1995 | Fu et al. ...................... 257/328 |
| 5,973,356 | A | * | 10/1999 | Noble et al. ................. 257/319 |
| 6,215,145 | B1 | * | 4/2001 | Noble ......................... 438/164 |
| 6,580,124 | B1 | * | 6/2003 | Cleeves et al. ............. 257/331 |

* cited by examiner

Primary Examiner—Michael Trinh
(74) Attorney, Agent, or Firm—Bacon & Thomas, PLLC

(57) ABSTRACT

The invention relates to a high density read only memory and fabrication method thereof through fabricating a plurality of spaced post transistors on a wafer by implanting and trench etching wherein each post transistor has four vertical surfaces with one of vertical surfaces as a short circuit junction between substrate and source and a read only memory (ROM) cell formed on each of the three remaining vertical surfaces. Therefore, the invention can fabricate three ROM cells in a single post transistor having a high density feature for storing three-bit data.

15 Claims, 10 Drawing Sheets

US 6,699,759 B2

HIGH DENSITY READ ONLY MEMORY AND FABRICATION METHOD THEREOF

This application is a Division of nonprovisional application Ser. No. 09/894,002, filed Jun. 29, 2001, now U.S. Pat. No. 6,462,387.

FIELD OF THE INVENTION

The present invention relates to semiconductor manufacturing process and more particularly to a high density read only memory (HDROM) and fabrication method thereof.

BACKGROUND OF THE INVENTION

Semiconductor fabrication technology have known a rapid and a spectacular development leading from sub micron fabrication to deep-sub micron fabrication. The size of thus produced semiconductor device is even smaller. As a result, the size of chip is decreased and the number of chips formed on each wafer is increased. And in turn the fabrication cost of each chip is reduced as the number and operating speed of transistors on a chip are increased. The number of transistors is double every one and half year based on Morgan's theory. As such, memory size of an integrated circuit (IC) has increased from past several thousand bits per chip to current several ten million bits per chip. In the case of read only memory (ROM), there are ICs having 1 Giga-bit capacity available now. Currently, ROMs having 64 million-bit are the most popular one.

In view of this trend, ROM capacity and operating speed will be higher as time goes as required by electronic product manufacturers. Hence, it is obvious that high density high capacity ROMs are the main stream of development. It is also anticipated that high density ROMs will replace current semiconductor products as the dominant product in the near future. As such, most semiconductor manufacturers endeavor to develop such products.

Currently, a NAND gate based architecture is incorporated in each cell of existing HDROMs for decreasing the number of contacts. It is advantageous for decreasing the area of chip. It is disadvantageous, however that resistance of serially connected cells becomes large by incorporating such NAND gate architecture. As such, a RC delay is occurred due to increase of resistance value (R) of the serially connected cell. And in turn the speed of reading, writing, or erasing is slowed. Further, ROMs having such NAND gates are fabricated by utilizing Fowler-Nordheim tunneling or hot carrier writing principle. Hence, cells tend to over program, thus causing the number of electrons in floating gate to increase excessively. As a result, critical threshold voltage of the conventional ROM cell is increased beyond control which in turn causes the channel of cell to be cut off permanently. Hence, such conventional HDROMs are limited in electronic applications. Thus improvement exists.

SUMMARY OF THE INVENTION

It is therefore an object of the present invention to provide a high density read only memory and fabrication method thereof. The method comprises the step of fabricating a plurality of spaced post transistors on a wafer by implanting and trench etching wherein each post transistor has four vertical surfaces with one of vertical surfaces as a short circuit junction between substrate and source and a read only memory (ROM) cell formed on each of the three remaining vertical surfaces. This can maintain a critical threshold voltage on transistors of ROM cells at the same level while there is a voltage drop between substrate and source thereof. Further, in the layout of ROM cells drains of ROM cells are alternately coupled together because a word line is shared by adjacent ROM cells. Therefore, the invention can fabricate three ROM cells in a single post transistor for storing three-bit data, thereby fabricating high density ROM cells.

The above and other objects, features and advantages of the present invention will become apparent from the following detailed description taken with the accompanying drawings.

DETAILED DESCRIPTION OF THE PREFERRED EMBODIMENTS

A high density read only memory (HDROM) of the invention is fabricated by the following process: Fabricating a plurality of spaced post transistors on a wafer by implanting and trench etching wherein each post transistor has four vertical surfaces with one of vertical surfaces as a short circuit junction between substrate and source and a read only memory (ROM) cell formed on each of the three remaining vertical surfaces. That is, the invention can fabricate three ROM cells in a single post transistor for storing three-bit data. As described that read only memory cell having a high density feature will be called high density read only memory (HDROM) in a description of the specification thereafter.

Figure 1:
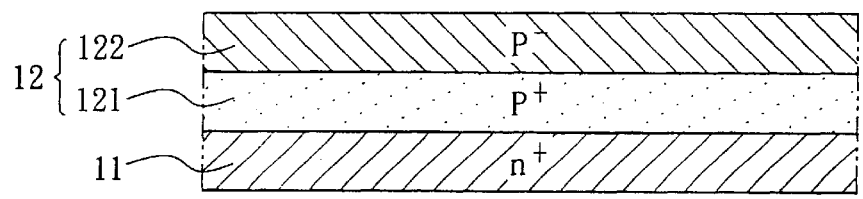
FIG. 1 is a cross-sectional view of P+ and P− type semiconductor layers having different densities being epitaxially fabricated according to the invention.
Figure 2A:
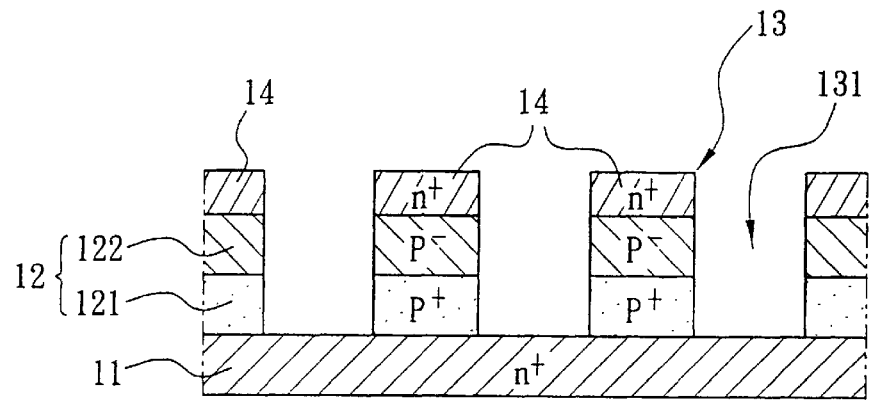
FIGS. 2A and 2B are cross-sectional and top plan views of plurality of spaced post transistors formed on wafer by lithography and trench etching according to the invention, respectively.
Figure 2B:
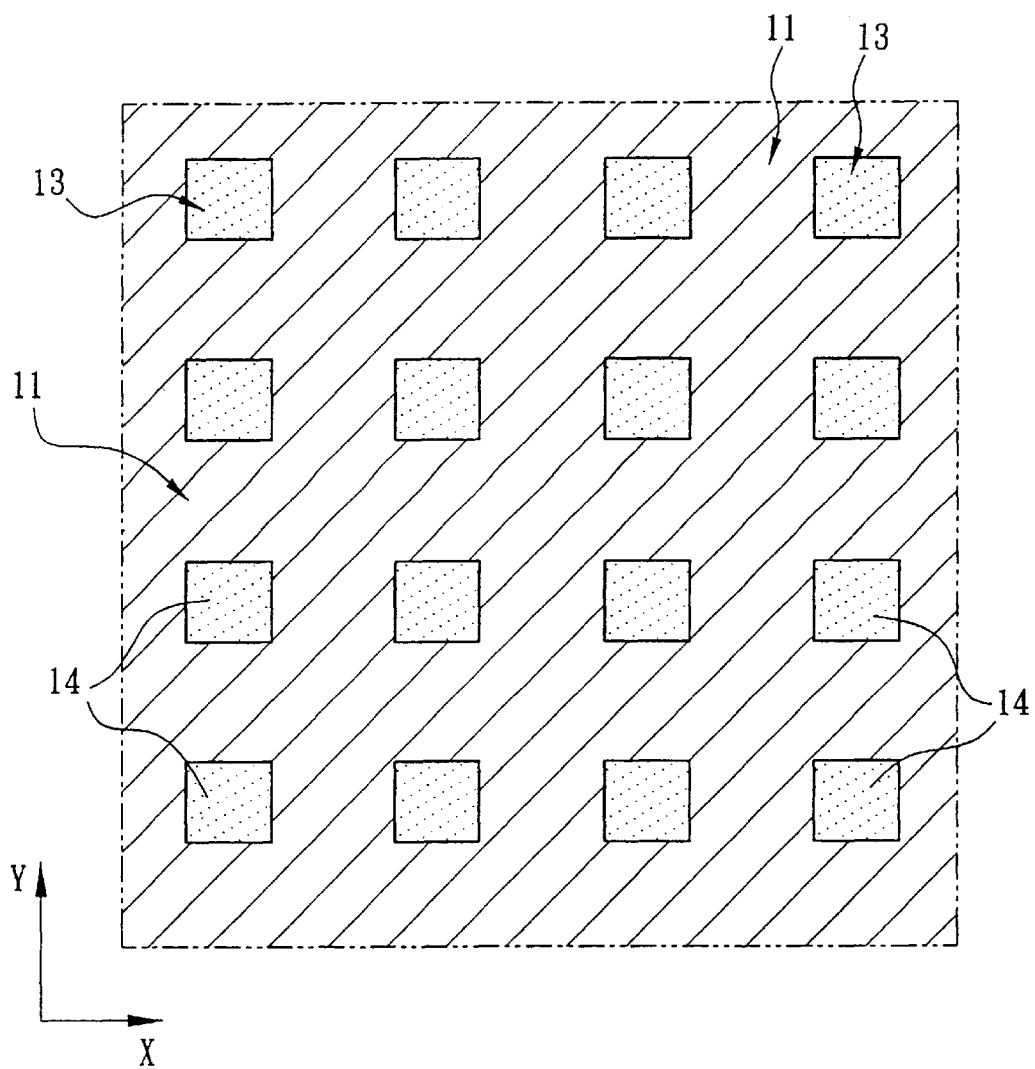

Referring to the drawings and particularly to FIG. 1 where a preferred embodiment of the invention is shown wherein a high density arsenic (As) is implanted on a p type wafer. The p type wafer is doped by As ions to form a n+ type semiconductor layer 11 which is served as source 11 of HDROM of the invention. Then a chemical vapor deposition (CVD) (note that a physical vapor deposition (PVD) or a photon-induced chemical vapor deposition (PCVD) may be employed in other embodiments) or implanting is employed to epitaxially fabricate (or implant) a p type semiconductor layer 12 having a thickness of about 0.5 to 2 $\mu$m on the n+ type semiconductor layer 11. In the invention after boron ions have been doped in the epitaxial process, doping density near n_type semiconductor layer 11 will be higher than that of other areas. The doping density will be decreased as the epitaxial thickness reaches about 0.2 to 0.4 $\mu$m. Hence, p+ and p– type semiconductor layers 121 and 122 are formed on the n+ type semiconductor layer 11. Then p+ and p– type semiconductor layer 121 and 122 are formed as substrate 121 and channel 122 of ROM cell respectively. Then fabricates a plurality of spaced post transistors 13 on the p+ and p– type semiconductor layer 121 and 122 by lithography and trench etching wherein each post transistor 13 has four vertical surfaces (FIG. 2A). Then high density phosphor (P) ions are implanted on post transistors 13 so as to dope P ions on the surface of p– type semiconductor layer 122 to form a n+ type semiconductor layer 14 on the top of each post transistor 13. n+ type semiconductor layer 14 is served as drain of HDROM cell of the invention. In the plan view of FIG. 2B, such formed transistors 13 are arranged in a matrix shape with each post transistor 13 equally spaced apart from the adjacent post transistor 13 in either X axis or Y axis.

In the epitaxial process, doping density of boron ions near source (i.e. n+ type semiconductor layer) 11 in p type semiconductor layer 12 is higher than that of other areas due to the following reasons:

(1) In the ROM cell manufacturing process, if boron ions on some channels 122 and substrate 121 have higher density, after ROM cells are processed in an anti-punch-through process the punch-through between the drain 14 and source 11 may not occur when a lower punch-through voltage is applied on ROM cells.

(2) Since a high voltage will apply on drain 14 of ROM cell low density boron ions near channel of drain 14 ROM cells may have a higher junction breakdown voltage when drain 14 of ROM cell is being programmed or erased.

(3) Since boron ions of ROM cell have a higher density near channel of source 11 the threshold voltage on the channel will be high. To the contrary, since boron ions of ROM cell have a lower density near another channel of drain 14 the threshold voltage on the channel will be low. Hence, there are two different levels of threshold voltage on the same channel. When a predetermined voltage is applied on gate to turn on the channel, a source-side-injection will occur to generate many gate hot carriers. As a result, the program efficiency and speed of electrons will be much higher than that of conventional stacked ROM cells.

(4) Typically, a Fowler-Nordheim tunneling or hot carrier writing principle is utilized in the conventional stacked ROM cells. Hence, cells tend to over program, thus causing the number of electrons in floating gate to increase excessively. As a result, critical threshold voltage of the conventional ROM cell is increased beyond control which in turn causes the channel of cell to be cut off permanently. In contrast in the invention p type semiconductor device 12 has two different density portions after implanted, thus causing critical voltage near source 11 to be higher for turning off the channel. As a result, an over erasure effect is eliminated.

Also, lithography and trench etching utilized by the invention to form post transistors 13 on semiconductor devices may cause an over etching. Hence, a space 131 is defined by four adjacent post transistors 13 after etching (FIG. 2A). The size of space 131 is suitable to fabricate floating gates, control gate, and insulated oxide of the invention therein. Hence, the width of space 131 is required to be equal to or larger than a minimum width for disposing two floating gates, a control gate, and insulated layers.

Figure 3:
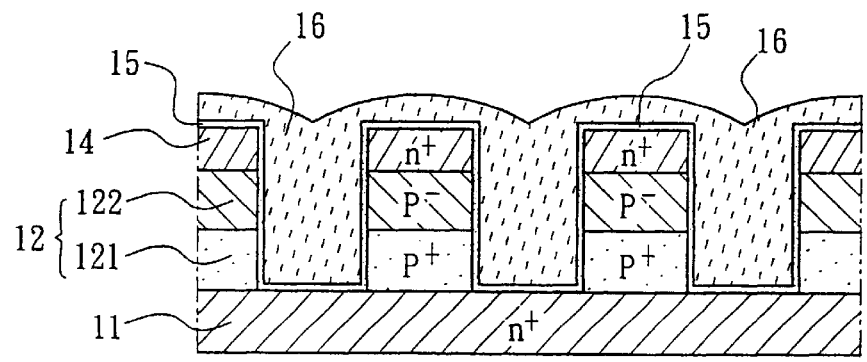
FIG. 3 is a cross-sectional view of FIG. 2-1 post transistors after oxidized and CVD epitaxially processed according to the invention.

Moreover, an oxidation process is performed on above semiconductor devices at a temperature about 800 to 950° C. by the invention so as to grow a first oxide layer 15 thereon (FIG. 3). The thickness of oxide layer 15 is about 70 to 120 Å. Such first oxide layer 15 is used as tunnel oxide of ROM cell in the invention. The quality of first oxide layer 15 determines the cycling endurance of ROM cell, the date retention of electrons in floating gate, and efficiency of programming and erasing electrons. Further, the oxidation also has the following meanings:

(1) Poly-silicon may be crystallized again to from a single crystal in a high temperature manufacturing process;

(2) Defect occurred in implanting in above high temperature manufacturing process may be repaired and doping in the implanting may be made active.

Figure 4:
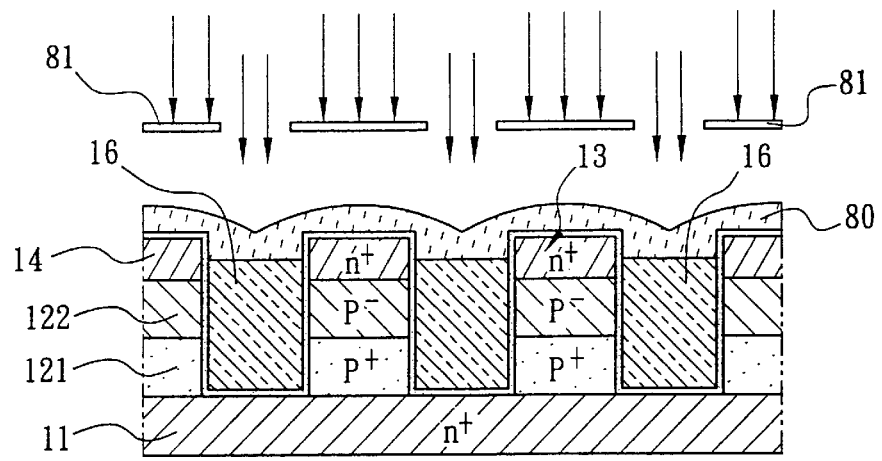
FIG. 4 is a cross-sectional view showing a first polysilicon layer formed on FIG. 3 post transistors according to the invention.
Figure 5:
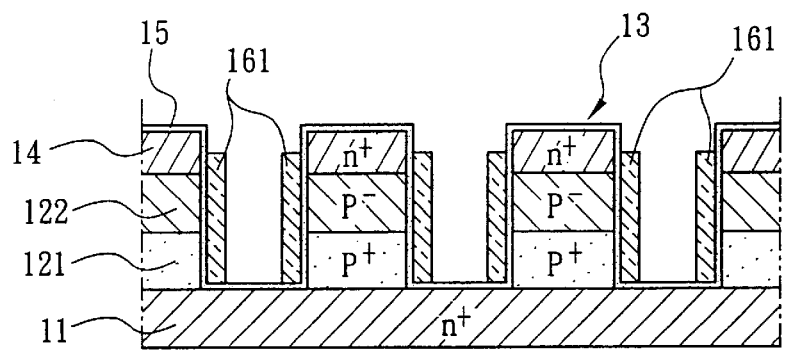
FIG. 5 is a cross-sectional view showing two floating gates formed on two adjacent FIG. 4 post transistors according to the invention.
Figure 6:
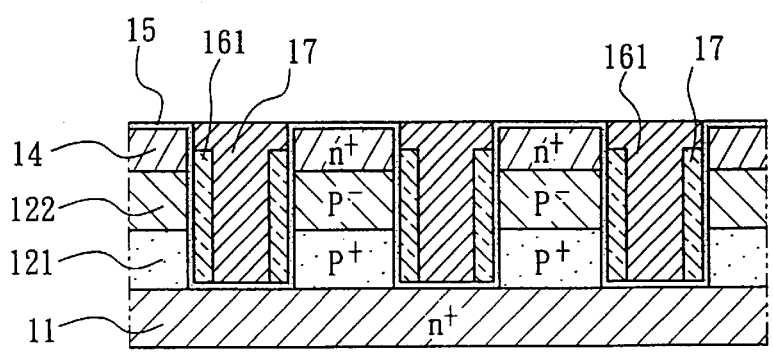
FIG. 6 is a cross-sectional view showing an ONO layer formed on FIG. 5 post transistors according to the invention.

Then the invention utilize CVD epitaxial technique to grow a first poly-silicon layer 16 on first oxide layer 15. Referring to FIG. 3 again, the thickness of first poly-silicon layer 16 is about 200 to 300 Å. First poly-silicon layer 16 is served as floating gate 16 on ROM cell in the invention. Then etch away a portion of first poly-silicon layer 16 so that there is no first poly-silicon layer 16 remained on the top of post transistor 13. Then a photoresist 80 is coated on post transistors 13 and first poly-silicon layer 16 (FIG. 4). A masking 81 and lithography are employed to define floating gates on first poly-silicon layer 16. A trench etching is then performed to etch away undesired poly-silicon and photoresist 80. Referring to FIG. 5, two floating gates 161 are formed between two adjacent post transistors 13. Then CVD epitaxial technique is alternately employed to grow oxide-nitride-oxide (ONO) layers 17 on semiconductor devices. ONO layers 17 remained on post transistors 13 are etched away to form desired ONO layers 17 (FIG. 6). In subsequent processes, such ONO layers 17 may be used as an insulation layer between later formed second poly-silicon layer and floating gate 161. In the invention a low temperature manufacturing process is employed to grow ONO layers 17 because doping density in ROM cells may be deformed in a high temperature manufacturing process.

Note that the whole surface of wafer is the object to be sequentially processed in previous processes by the invention. Hence, after ONO layers 17 have been formed the configuration of one side of post transistors 13 (e.g., viewed along X axis) is the same as that of the other side of post transistors 13 (e.g., viewed along Y axis). However, in the following manufacturing processes of the invention the configuration of one side of semiconductor devices (e.g., viewed along X axis) is not the same as that of the other side of semiconductor devices (e.g., viewed along Y axis). Hence, the difference between the configuration as viewed along X axis and that as viewed along Y axis will be described in the following specification.

Figure 7:
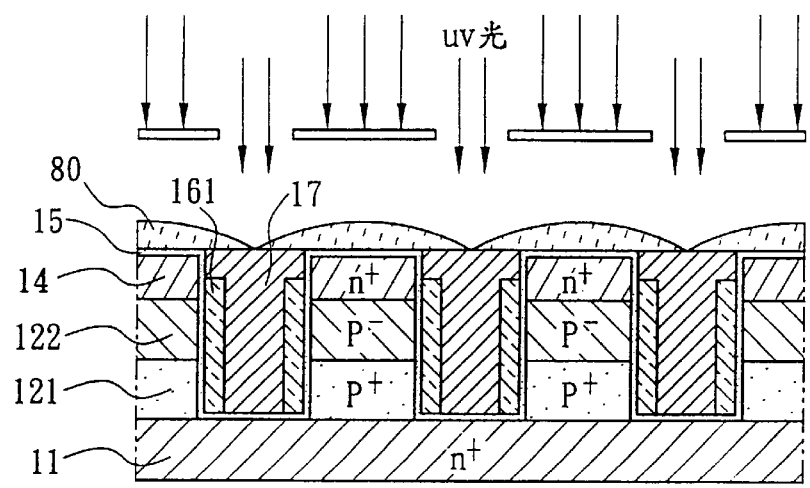
FIG. 7 is a cross-sectional view along Y axis after control gate is defined in Y axis by performing a masking and lithography on ONO layer between FIG. 6 post transistors arranged in Y axis according to the invention.
Figure 8:
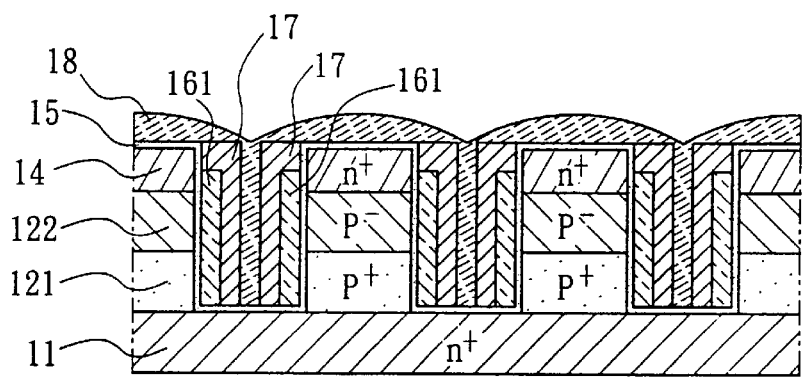
FIG. 8 is a cross-sectional view along Y axis after control gate is formed in Y axis on remained ONO layer between FIG. 6 post transistors arranged in Y axis according to the invention.
Figure 9:
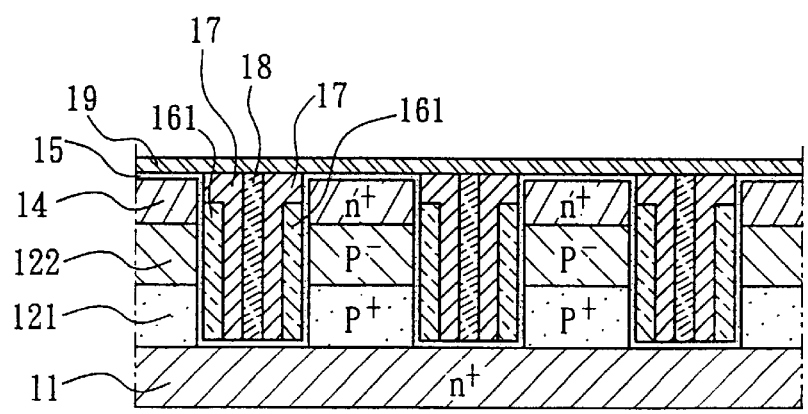
FIG. 9 is a cross-sectional view along Y axis after a second oxide layer is formed on control gate arranged in Y axis by perfroming CVD epitaxy processing according to the invention.

Referring to FIG. 7, photoresist 80 is coated on semiconductor devices in the invention. Then a masking 81 and lithography are employed to define control gate in Y axis on ONO layers 17 which are located in post transistors 13 along Y axis. Referring to FIG. 8, a trench etching is then performed to etch away undesired ONO layers 17 and photoresist 80. Hence, a space is formed in ONO layers 17 for fabricating control gate. Then CVD epitaxial technique is employed to grow a second poly-silicon layer 18 on semiconductor device and ONO layers. Referring to FIG. 8, the second poly-silicon layer 18 is served as control gate 18 in Y axis of ROM cells by the invention. Second poly-silicon layer 18 is extended along X axis to connect ROM cells in X axis together. As an end, a word line W is formed of ROM cells. Then etch away undesired second poly-silicon layer 18 on semiconductor devices. Then CVD epitaxial is employed to grow a second oxide layer 19 on the whole semiconductor device. The cross-section of such ROM cells along Y axis is shown in FIG. 9.

Figure 10:
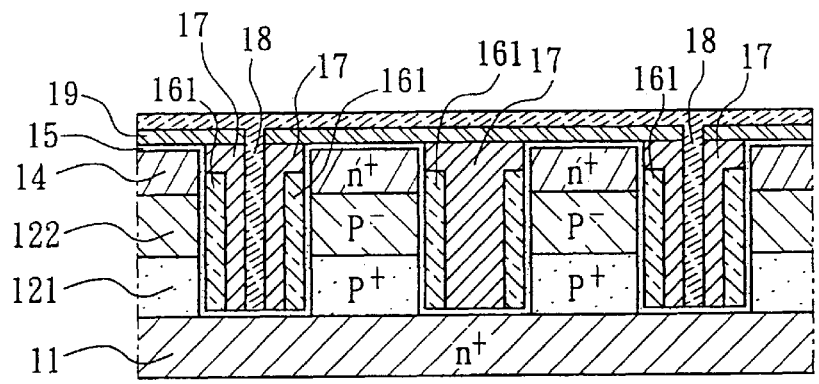
FIG. 10 is a cross-sectional view along X axis after control gate is formed in X axis on ONO layer between post transistors arranged in X axis according to the invention.
Figure 11:
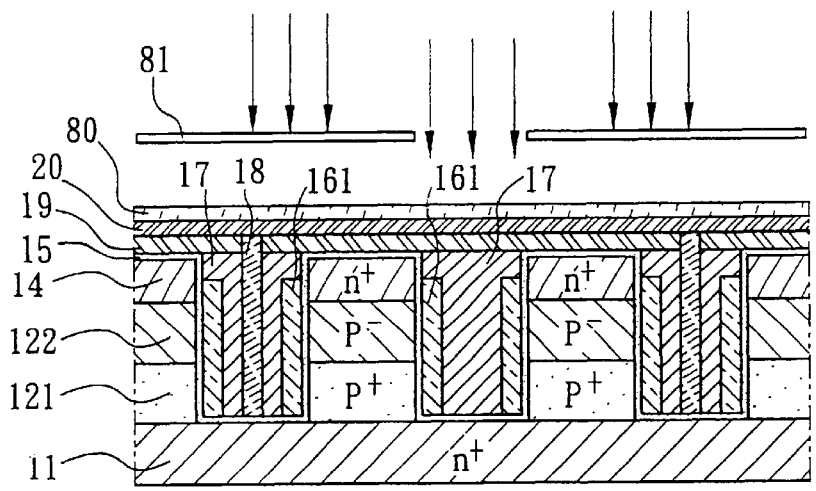
FIG. 11 is a cross-sectional view along X axis after a first metal layer is defined by performing a masking and lithography on remained ONO layer between post transistors arranged in X axis according to the invention.

Then a masking and a lithography are employed to alternately define control gate in X axis on ONO layers 17 which are located in post transistors 13 along X axis. Then trench etching is performed to etch away undesired ONO layers 17 and photoresist 80. Hence, a space is alternately formed in ONO layers 17 for fabricating control gate. Then CVD epitaxial technique is employed to grow a second poly-silicon layer 18 on ONO layers 17 as control gate 18 in X axis of ROM cells. The cross-section thereof along X axis is shown in FIG. 10. Referring to FIG. 11, etch away undesired second poly-silicon layer 18 on semiconductor devices. Then CVD epitaxial is employed to grow a third oxide layer 20 on the whole semiconductor device. In subsequent processes third oxide layer 20 may be used as an insulation layer between later formed first metal layer and control gate 18. The cross-section of such ROM cells along X axis is shown in FIG. 11.

Figure 12:
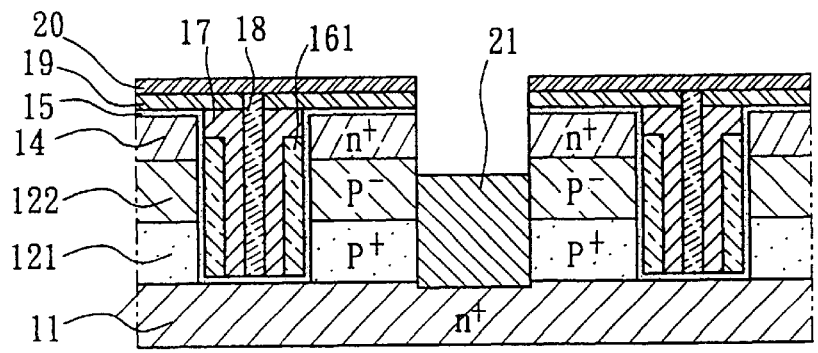
FIG. 12 is a cross-sectional view along X axis after control gate is formed on post transistors arranged in X axis according to the invention.

Then a masking 81 and a lithography are employed by the invention to define a short circuit region between substrate 121 and source 11 of ROM cell in post transistors 13 along X axis. In other words, a trench etching is performed to over etch the short circuit region on portions of ONO layers 17 where control gate 18 is not formed in post transistors 13 along X axis. After, the short circuit region is over etched to source 11 as shown in FIG. 12, a first metal layer 21 is coated thereon. As such, a short circuit is formed between substrate 121 and source 11 of ROM cells along X axis. Finally, a trench etching is employed to etch away undesired metal layer 21. The cross-section thereof along X axis is shown in FIG. 12.

Figure 13:
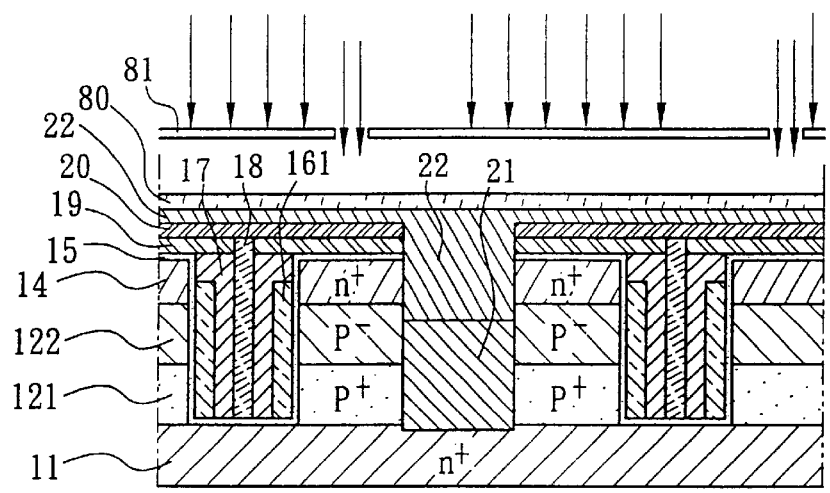
FIG. 13 is a cross-sectional view along X axis after drain contacts are formed by performing a masking and lithography on post transistors arranged in X axis according to the invention.
Figure 14A:
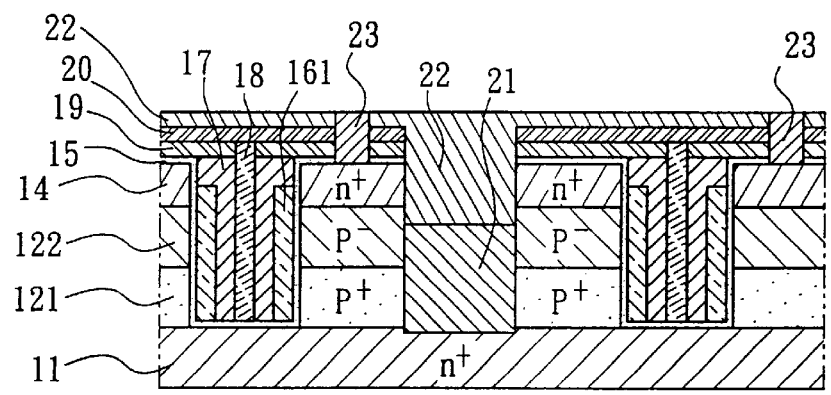
FIG. 14A is a cross-sectional view along X axis and FIG. 14B is a top plan view respectively for illustrating a layout with formed bit lines on drain of ROM cell and a second metal layer formed on post transistors arranged in X axis according to the invention.
Figure 14B:
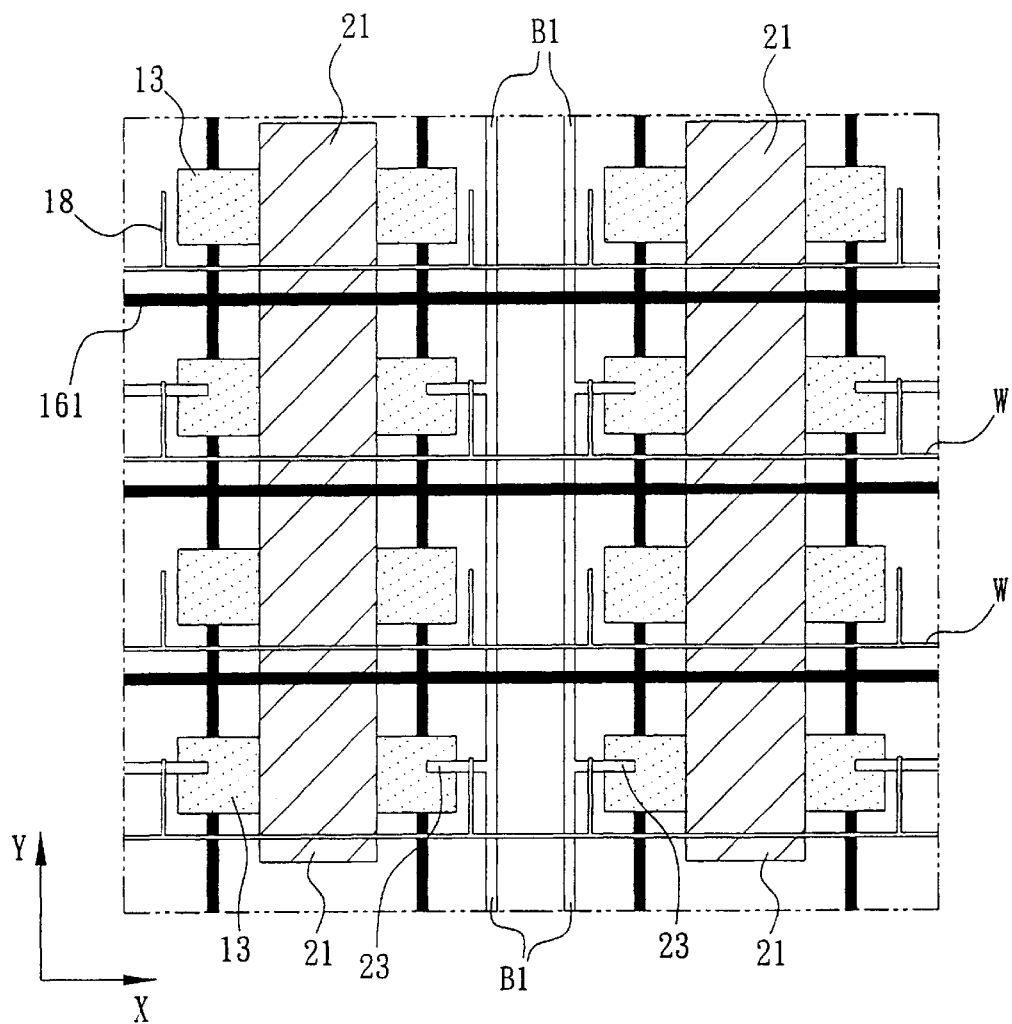

Thereafter a high density plasma (HDP) is employed by the invention to grow a fourth oxide layer 22 on the whole semiconductor device as shown in FIG. 13. In subsequent processes fourth oxide layer 20 may be used as an insulation layer between later formed second metal layer and first metal layer 21. Then coat a photoresist 80 on fourth oxide layer 20. Further, a masking 81 and a lithography are employed to alternately define a drain 14 of ROM cell adjacent to a post transistor of first metal layer 21. In FIG. 13, trench etching is employed to etch away undesired oxide layers 15, 19, 20, and 22 on drain 14 and photoresist 80. Then coat a second metal layer 23 on the portion left by above removed oxides. Referring to FIG. 14A, second metal layer 23 is coupled to drains 14 along Y axis so as to serve as a bit line B1 of ROM cells. 14A is a cross-sectional view along X axis and FIG. 14B is a top plan view for illustrating a layout of ROM cells respectively. It is important to note that bit line B1 is extended along Y axis to be alternately formed on corresponding drain 14 of post transistor. As viewed by post transistors bit line B1 are alternately coupled to corresponding drains 14 along Y axis.

Figure 15A:
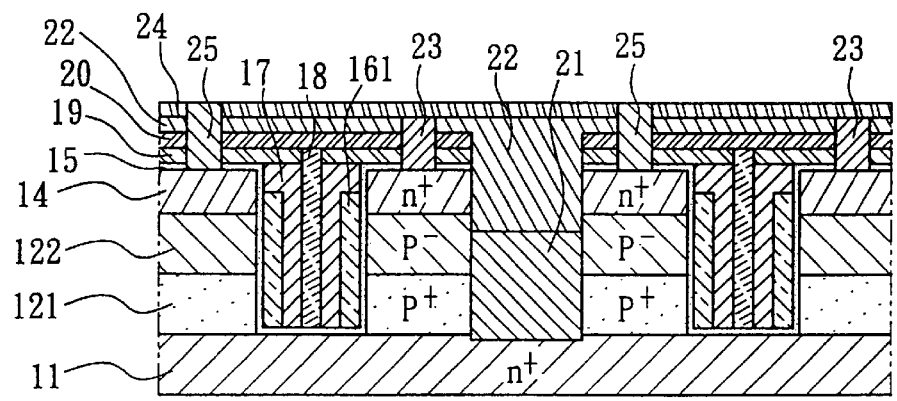
FIG. 15A is a cross-sectional along X axis and FIG. 15B is a top plan view respectively for illustrating another layout with formed contacts on post transistors arranged in X axis by performing a masking an lithography according to the invention.
Figure 15B:
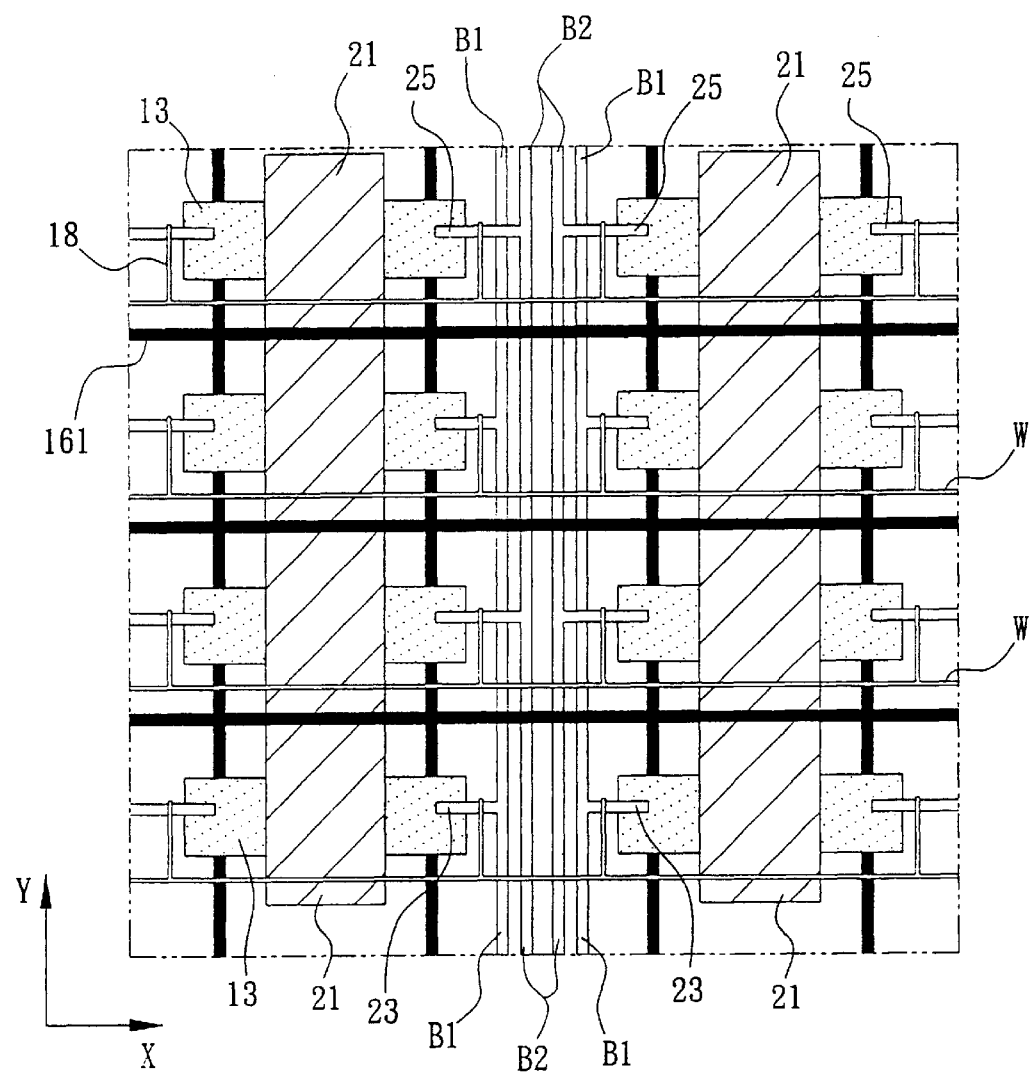

Thereafter a CVD epitaxial technique is employed to grow a fifth oxide layer 24 on the whole semiconductor device as shown in FIG. 15-1. In subsequent processes fifth oxide layer 24 may be used as an insulation layer between later formed third metal layer and bit line. Then coat a photoresist 80 on fifth oxide layer 24. Further, a masking 81 and a lithography are employed to alternately define the other drain 14 of ROM cell adjacent to the other post transistor of first metal layer 21. In FIG. 15A, trench etching is employed to etch away undesired oxide layers 15, 19, 20, 22 and 24 on the other drain 14 and photoresist 80. Then coat a third metal layer 25 on the portion left by above removed oxides. Third metal layer 25 is coupled to the other drains 14 along Y axis so as to serve as the other bit line B2 of ROM cells. FIG. 15A is a cross-sectional view along X axis and FIG. 15B is a top plan view for illustrating a layout of ROM cells respectively. It is also important to note that bit line B2 is extended along Y axis to be alternately formed on the corresponding other drain 14 of post transistor. As viewed by post transistors bit lines B1 are alternately coupled to the corresponding other drains 14 along Y axis.

Figure 16:
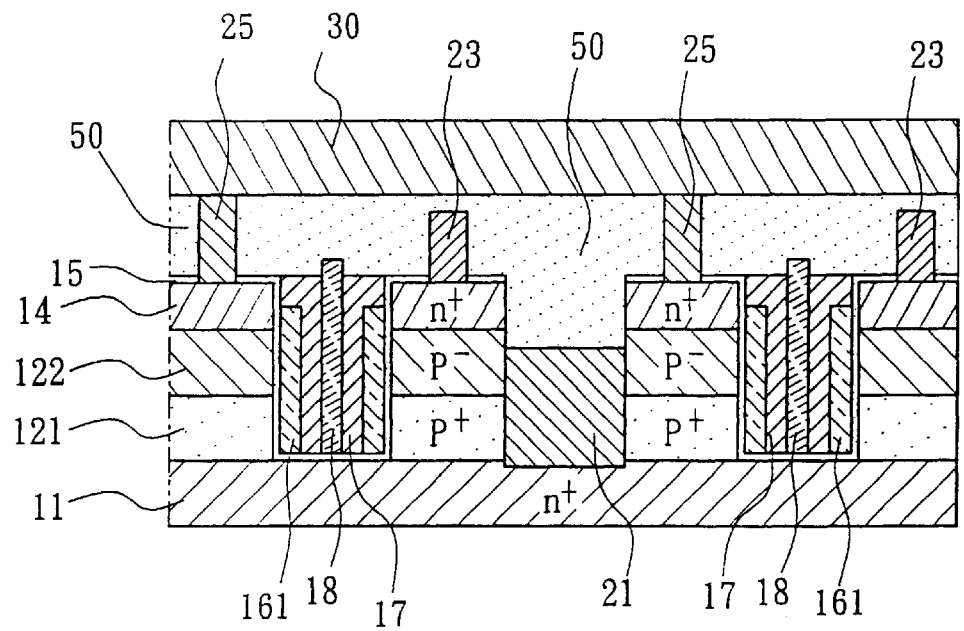
FIG. 16 is a cross-sectional view of ROM cell along X axis during the HDROM manufacturing process according to the invention.

Finally, a protective layer 30 is coated on the whole semiconductor device for forming the HDROM of the invention. FIG. 16 is a cross-sectional view along X axis respect to ROM cells disposed in X axis wherein an insulation layer formed by oxides 19, 20, 22 and 24 is labeled by numeral 50.

Figure 17:
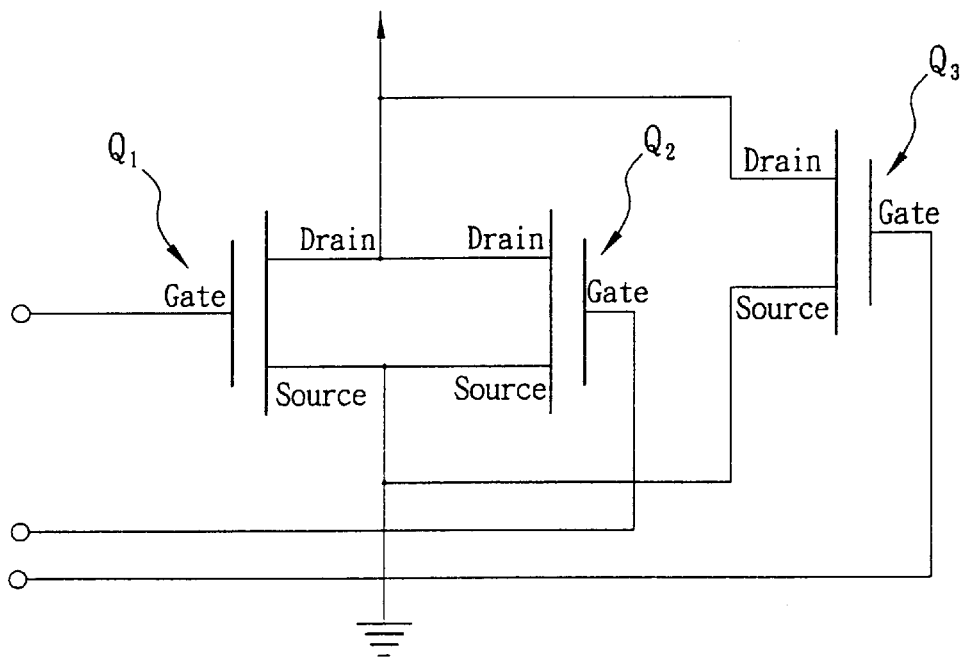
FIG. 17 is a circuit diagram incorporating three ROM cells formed on each post transistor according to the invention.

By utilizing above manufacturing process of the invention, it is possible to fabricate three ROM cells Q1, Q2 and Q3 in a single post transistor for storing three-bit data. An equivalent circuit of above ROM cells is shown in FIG. 17. The operation of the ROM cells is as follows in conjunction with the layout of ROM cells shown in FIG. 15B:

(1) In writing data into a ROM cell Q1, a high voltage (e.g., 10 volt) is applied to word line W to turn on ROM cell Q1 and maintain word line W at the same high voltage (e.g., 10 volt). Then above source-side-injection may be employed to inject electrons into floating gates 161 of ROM cells for completing data writing.

(2) In erasing data from ROM cell Q1, a negative high voltage (e.g., −5 volt) is applied to word line W to maintain bit line B1 at a high voltage (e.g., 10 volt). Then above Fowler-Nordheim tunneling may be employed to inject electrons of ROM cells into drains 14 of ROM cells for completing data erasing. Alternatively, apply a high voltage (e.g., 10 volt) to source 11. Then above Fowler-Nordheim tunneling may be employed to inject electrons of floating gates 161 into sources 11 for completing data erasing.

(3) In reading data from a ROM cell Q1, a low voltage (e.g., 3 volt) is applied to word line W and bit line B1 is maintained at the same voltage (e.g., 3 volt). Hence, it is possible to determine whether a logical "1" or "0" value represented by electrons is stored in floating gate 161 of ROM cell Q1 by reading a current value from drain 14.

In brief, each post transistor of the invention is shared by three ROM cells. Hence, the capacity of memory thus fabricated is three times larger than that of conventional memory. Further, post transistors are of high density, thus effectively reducing occupied area of source contacts. As a result, the size of ROMs is reduced significantly, resulting in an increase of the number of ROMs fabricated on a single wafer.

While the invention has been described by means of specific embodiments, numerous modifications and variations could be made thereto by those skilled in the art without departing from the scope and spirit of the invention set forth in the claims.

What is claimed is:

1. A method for fabricating a high density read only memory (HDROM) comprising the steps of:

fabricating a plurality of spaced post transistors on a wafer wherein each post transistor has four vertical surfaces with one of said vertical surfaces as a short circuit junction between a substrate and a source of said post transistors and a read only memory (ROM) cell formed on each of said other vertical surfaces, wherein said wafer is a first n+ type semiconductor layer arranged to serve as a source; and growing a first p type semiconductor layer on a top of said first n+ type semiconductor layer, wherein in fabricating said first p type semiconductor layer a doping density near said first n+ type semiconductor layer is made higher than that of other areas and the doping density is subsequently decreased so as to grow two second p type semiconductor layers having different doping densities to serve as a substrate and a channel respectively.

2. The method of claim 1, wherein a thickness of each second p type semiconductor layer is about 0.5 to about 2 $\mu$m.

3. The method of claim 2, wherein in fabricating said second p type semiconductor layer a doping density near said first n+ type semiconductor layer is made higher than that of other areas and the doping density is subsequently decreased when an epitaxial thickness thereof has reached about 0.2 to about 0.4 $\mu$m.

4. The method of claim 1, further comprising growing a second n+ type semiconductor layer on each second p type semiconductor layer by implanting wherein said second n+ type semiconductor layer serves as a drain shared by three ROM cells on said post transistor.

5. The method of claim 4, further comprising oxidizing said semiconductor layers to grow a first oxide layer.

6. The method of claim 5, wherein an oxidation temperature is about 800° C. to about 950° C.

7. The method of claim 5, wherein a thickness of said first oxide layer is about 70 to about 120 A.

8. The method of claim 5, further comprising utilizing an epitaxial technique to grow a first poly-silicon layer on said first oxide layer, etching away said first poly-silicon layer on top of said post transistors, etching away an undesired portion of said first poly-silicon layer between two of said adjacent post transistors, and forming two floating gates on a remaining said first poly-silicon layer between said adjacent post transistors.

9. The method of claim 8, further comprising utilizing the epitaxial technique to grow an oxide-nitride-oxide (ONO) layer on said semiconductor layers, etching away said ONO layer on top of said post transistors, utilizing masking and lithography to etch away an undesired portion of said ONO layers between said post transistors disposed along a first coordinate axis, and utilizing the epitaxial technique to grow a first poly-silicon layer on a remaining said ONO layers to serve as a floating gate of said ROM cells along said first coordinate axis wherein said second poly-silicon layer extends along a second coordinate axis perpendicular to said first coordinate axis to connect said ROM cells disposed along said second coordinate axis together for forming a word line of said ROM cells.

10. The method of claim 9, further comprising utilizing the epitaxial technique to grow a second oxide layer on said semiconductor layers.

11. The method of claim 10, further comprising utilizing the masking and the lithography to alternately etch away an undesired portion of said ONO layers between said post transistors disposed along said second coordinate axis, and utilizing the epitaxial technique to grow a second poly-silicon layer on said ONO layers to serve as a control gate of said ROM cells along said second coordinate axis.

12. The method of claim 11, further comprising utilizing the epitaxial technique to grow a third oxide layer on said semiconductor layers.

13. The method of claim 12, further comprising utilizing the masking and the lithography to over etch portions other than said formed control gate of said post transistors disposed along said second coordinate axis to form a short circuit region between said substrate and said source of said ROM cell, over etching said short circuit region to said source, and coating a first metal layer thereon.

14. The method of claim 13, further comprising utilizing the epitaxial technique to grow a fourth oxide layer on said semiconductor layers.

15. The method of claim 14, further comprising utilizing the masking and the lithography to alternately etch away an undesired portion of said oxide layers on a top of said drains adjacent said post transistors of said first metal layer, coating a second metal layer on portion left by said removed oxide layers, and coupling said second metal layer to said drains along said first coordinate axis for serving as a bit line of said ROM cells.

* * * * *